(12) United States Patent
Zhu et al.

(10) Patent No.: US 12,029,067 B2
(45) Date of Patent: Jul. 2, 2024

(54) DISPLAY SUBSTRATE AND DISPLAY DEVICE

(71) Applicants: Chengdu BOE Optoelectronics Technology Co., Ltd., Sichuan (CN); BOE Technology Group Co., Ltd., Beijing (CN)

(72) Inventors: Junming Zhu, Beijing (CN); Lei Chen, Beijing (CN); Kun Ma, Beijing (CN); Rongrong Gao, Beijing (CN); Juncong Li, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 197 days.

(21) Appl. No.: 17/526,867

(22) Filed: Nov. 15, 2021

(65) Prior Publication Data
US 2022/0320468 A1   Oct. 6, 2022

(30) Foreign Application Priority Data
Mar. 31, 2021 (CN) .......................... 202110347900.3

(51) Int. Cl.
*H10K 50/856*   (2023.01)
*H10K 102/00*   (2023.01)

(52) U.S. Cl.
CPC ..... *H10K 50/856* (2023.02); *H10K 2102/351* (2023.02)

(58) Field of Classification Search
CPC ... H10K 2102/3031; H10K 2102/3023; H10K 2102/3035; H10K 2102/3026;
(Continued)

(56) References Cited

U.S. PATENT DOCUMENTS 5,742,129 A * 4/1998 Nagayama ............. H05B 33/26
315/169.3
6,069,443 A * 5/2000 Jones .................... H10K 59/173
313/506
(Continued)

FOREIGN PATENT DOCUMENTS

CN   104932145 A   9/2015
CN   105870284 A   6/2016
(Continued)

OTHER PUBLICATIONS

CN 202110347900.3 first office action.

*Primary Examiner* — Sophia T Nguyen
(74) *Attorney, Agent, or Firm* — IPro, PLLC

(57) ABSTRACT

A display substrate and a display device are provided. The display substrate includes: a base substrate; and a light-emitting element arranged on the base substrate, and including a first electrode, an organic functional layer and a second electrode arranged sequentially in that order in a direction away from the base substrate. The light-emitting element includes a first surface proximate to the base substrate, a second surface distal to the base substrate, and a side surface arranged between the first surface and the second surface. The display substrate further includes a reflection layer covering at least a part of the side surface and configured to reflect light from the organic functional layer.

12 Claims, 6 Drawing Sheets

(58) Field of Classification Search
CPC ...... H10K 59/128; H10K 50/19; H10K 50/11;
H10K 50/157; H10K 50/167; H10K
50/171; H10K 50/181; H10K 50/8426;
H10K 50/8423; H10K 50/8428; H10K
50/856; H10K 50/818
See application file for complete search history.

(56) References Cited

U.S. PATENT DOCUMENTS

| | | | | |
|---|---|---|---|---|
| 6,091,197 | A * | 7/2000 | Sun | H10K 50/852 |
| | | | | 313/506 |
| 6,566,156 | B1 * | 5/2003 | Sturm | H10K 50/8423 |
| | | | | 438/82 |
| 6,887,392 | B2 * | 5/2005 | Ogino | H10K 59/35 |
| | | | | 216/5 |
| 7,122,845 | B2 * | 10/2006 | Uchida | H10K 50/852 |
| | | | | 257/89 |
| 7,294,856 | B2 * | 11/2007 | Ito | H10K 59/122 |
| | | | | 257/82 |
| 7,492,092 | B2 * | 2/2009 | Yamauchi | H10K 50/858 |
| | | | | 313/506 |
| 7,518,141 | B2 * | 4/2009 | Nakamura | H10K 50/852 |
| | | | | 257/40 |
| 7,564,063 | B2 * | 7/2009 | Cok | H10K 50/805 |
| | | | | 257/E51.019 |
| 7,781,962 | B2 * | 8/2010 | Adachi | H10K 59/38 |
| | | | | 313/506 |
| 7,915,814 | B2 * | 3/2011 | Matsudate | H10K 59/131 |
| | | | | 313/505 |
| 8,198,808 | B2 * | 6/2012 | Chan | H10K 50/818 |
| | | | | 313/506 |
| 8,258,508 | B2 * | 9/2012 | Matsuura | H10K 85/20 |
| | | | | 257/E51.038 |
| 8,987,717 | B2 * | 3/2015 | Kang | H10K 59/122 |
| | | | | 438/34 |
| 9,111,888 | B2 * | 8/2015 | Do | H10K 50/805 |
| 9,324,962 | B2 * | 4/2016 | Kim | H10K 50/854 |
| 9,412,969 | B2 * | 8/2016 | Kim | H10K 71/13 |
| 9,978,818 | B2 * | 5/2018 | Xiong | H10K 59/122 |
| 10,170,526 | B1 * | 1/2019 | Yang | H10K 71/00 |
| 10,325,970 | B2 * | 6/2019 | Bang | H10K 71/166 |
| 10,580,843 | B2 * | 3/2020 | Zhao | H10K 50/8445 |
| 10,615,231 | B2 * | 4/2020 | Wu | H10K 50/81 |
| 10,658,621 | B2 * | 5/2020 | Liu | H10K 59/122 |
| 10,777,768 | B2 * | 9/2020 | Zhou | H10K 50/85 |
| 10,892,432 | B2 * | 1/2021 | Niboshi | H10K 59/35 |
| 10,916,589 | B2 * | 2/2021 | Bang | G02F 1/133526 |
| 11,289,677 | B2 * | 3/2022 | Xing | H10K 50/87 |
| 11,296,160 | B2 * | 4/2022 | Lv | H10K 50/856 |
| 11,380,748 | B2 * | 7/2022 | Hou | H10K 19/901 |
| 11,508,945 | B2 * | 11/2022 | Zhu | H10K 50/85 |
| 11,527,732 | B1 * | 12/2022 | Chen | H10K 50/816 |
| 11,690,254 | B2 * | 6/2023 | Choung | H10K 50/84 |
| | | | | 257/40 |
| 2001/0001050 | A1 * | 5/2001 | Miyashita | H10K 59/35 |
| | | | | 428/690 |
| 2002/0030770 | A1 * | 3/2002 | Tsutsui | H10K 50/844 |
| | | | | 349/58 |
| 2004/0042199 | A1 * | 3/2004 | Cok | H10K 59/90 |
| | | | | 362/652 |
| 2004/0113550 | A1 * | 6/2004 | Adachi | H05B 33/22 |
| | | | | 313/512 |
| 2004/0160165 | A1 * | 8/2004 | Yamauchi | H10K 59/173 |
| | | | | 313/498 |
| 2004/0211969 | A1 * | 10/2004 | Ishizaki | H01L 33/44 |
| | | | | 257/E33.068 |
| 2004/0245541 | A1 * | 12/2004 | Shitagaki | H10K 50/828 |
| | | | | 313/504 |
| 2005/0007015 | A1 * | 1/2005 | Yokoyama | H10K 50/824 |
| | | | | 313/506 |
| 2005/0007517 | A1 * | 1/2005 | Anandan | H10K 77/10 |
| | | | | 349/69 |
| 2005/0062412 | A1 * | 3/2005 | Taniguchi | H10K 50/841 |
| | | | | 313/512 |
| 2005/0116620 | A1 * | 6/2005 | Kobayashi | H10K 50/856 |
| | | | | 313/506 |
| 2005/0162077 | A1 * | 7/2005 | Park | H10K 59/874 |
| | | | | 313/504 |
| 2005/0269947 | A1 * | 12/2005 | Kobayashi | H10K 50/852 |
| | | | | 313/504 |
| 2006/0170340 | A1 * | 8/2006 | Tzen | H10K 59/38 |
| | | | | 313/506 |
| 2006/0244370 | A1 * | 11/2006 | Tyan | H10K 50/852 |
| | | | | 313/506 |
| 2007/0126355 | A1 * | 6/2007 | Chiu | H10K 50/841 |
| | | | | 313/503 |
| 2007/0131944 | A1 * | 6/2007 | Hu | H10K 59/90 |
| | | | | 257/81 |
| 2007/0164665 | A1 * | 7/2007 | Hu | H10K 59/128 |
| | | | | 313/504 |
| 2007/0170846 | A1 * | 7/2007 | Choi | H10K 50/8426 |
| | | | | 313/506 |
| 2007/0241664 | A1 * | 10/2007 | Sakamoto | H10K 50/824 |
| | | | | 313/503 |
| 2007/0273278 | A1 * | 11/2007 | Hu | H10K 50/85 |
| | | | | 313/506 |
| 2008/0036367 | A1 * | 2/2008 | Eida | H10K 59/38 |
| | | | | 313/504 |
| 2008/0151141 | A1 | 6/2008 | Huang et al. | |
| 2008/0211393 | A1 * | 9/2008 | Yaegashi | H10K 50/8426 |
| | | | | 313/504 |
| 2009/0009069 | A1 * | 1/2009 | Takata | H10K 50/824 |
| | | | | 445/24 |
| 2009/0097234 | A1 * | 4/2009 | von Malm | A45F 3/042 |
| | | | | 362/296.07 |
| 2009/0174320 | A1 * | 7/2009 | Kim | H10K 50/805 |
| | | | | 313/504 |
| 2009/0230415 | A1 * | 9/2009 | Ide | H10K 59/32 |
| | | | | 257/40 |
| 2009/0236981 | A1 * | 9/2009 | Chang | H10K 50/856 |
| | | | | 313/504 |
| 2010/0181554 | A1 * | 7/2010 | Yoshida | H10K 50/85 |
| | | | | 257/40 |
| 2010/0289728 | A1 * | 11/2010 | Nakatani | H10K 71/12 |
| | | | | 345/76 |
| 2010/0327297 | A1 * | 12/2010 | Yoshida | H10K 59/124 |
| | | | | 257/89 |
| 2012/0012834 | A1 * | 1/2012 | Sonoda | H10K 59/173 |
| | | | | 257/40 |
| 2012/0286294 | A1 * | 11/2012 | Ishizuya | H10K 59/879 |
| | | | | 257/40 |
| 2012/0326180 | A1 * | 12/2012 | Ohe | H10K 59/38 |
| | | | | 257/98 |
| 2013/0099659 | A1 * | 4/2013 | Park | H10K 50/11 |
| | | | | 313/504 |
| 2013/0112953 | A1 * | 5/2013 | Nobuki | H10K 50/856 |
| | | | | 257/40 |
| 2013/0187163 | A1 * | 7/2013 | Kim | H10K 59/122 |
| | | | | 438/34 |
| 2013/0285039 | A1 * | 10/2013 | Ishihara | H10K 50/13 |
| | | | | 257/40 |
| 2013/0299816 | A1 * | 11/2013 | Bessho | H01L 33/50 |
| | | | | 257/40 |
| 2013/0306952 | A1 * | 11/2013 | Yamae | H10K 50/805 |
| | | | | 257/40 |
| 2014/0027729 | A1 * | 1/2014 | So | H10K 50/16 |
| | | | | 438/34 |
| 2014/0070175 | A1 * | 3/2014 | Kang | H10K 59/122 |
| | | | | 438/34 |
| 2014/0070182 | A1 * | 3/2014 | Choi | H10K 50/856 |
| | | | | 257/40 |
| 2014/0311668 | A1 * | 10/2014 | Yanagi | H05B 33/10 |
| | | | | 156/379.8 |
| 2014/0361265 | A1 * | 12/2014 | Liu | H10K 50/818 |
| | | | | 257/40 |
| 2015/0060820 | A1 * | 3/2015 | Takagi | H10K 50/818 |
| | | | | 438/46 |

(56) References Cited

U.S. PATENT DOCUMENTS

| | | | | |
|---|---|---|---|---|
| 2015/0123952 A1* | 5/2015 | Kim | ............... | G09G 3/3233 |
| | | | | 345/82 |
| 2015/0144896 A1* | 5/2015 | Joo | ............... | H10K 50/854 |
| | | | | 257/40 |
| 2015/0171379 A1* | 6/2015 | Min | ............... | H10K 50/16 |
| | | | | 438/34 |
| 2015/0340647 A1* | 11/2015 | Wang | ............... | H10K 50/80 |
| | | | | 438/26 |
| 2015/0352521 A1* | 12/2015 | Lee | ............... | B01J 20/0281 |
| | | | | 257/40 |
| 2016/0043161 A1* | 2/2016 | Miyazawa | ............... | H10K 59/1315 |
| | | | | 257/40 |
| 2016/0266436 A1* | 9/2016 | Jiao | ............... | H10K 50/828 |
| 2016/0284772 A1* | 9/2016 | Chaji | ............... | G06F 3/0412 |
| 2016/0336536 A1* | 11/2016 | Qu | ............... | H10K 71/00 |
| 2016/0336539 A1* | 11/2016 | Liu | ............... | H10K 50/8426 |
| 2016/0343791 A1* | 11/2016 | Liu | ............... | H10K 59/128 |
| 2016/0343975 A1* | 11/2016 | Liu | ............... | H10K 71/00 |
| 2016/0359142 A1* | 12/2016 | Huangfu | ............... | H10K 71/166 |
| 2016/0372529 A1* | 12/2016 | Wu | ............... | H10K 59/127 |
| 2016/0372700 A1* | 12/2016 | Baisl | ............... | H10K 50/846 |
| 2016/0380228 A1* | 12/2016 | Yang | ............... | H10K 50/8426 |
| | | | | 257/40 |
| 2017/0047553 A1* | 2/2017 | Yang | ............... | H10K 50/858 |
| 2017/0062759 A1* | 3/2017 | Gai | ............... | H10K 50/8428 |
| 2017/0062767 A1* | 3/2017 | Bao | ............... | H10K 50/171 |
| 2017/0069695 A1* | 3/2017 | Choung | ............... | H10K 59/122 |
| 2017/0077444 A1* | 3/2017 | Yamazaki | ............... | H10K 50/84 |
| 2017/0168223 A1 | 6/2017 | Feng | | |
| 2017/0194602 A1* | 7/2017 | Cui | ............... | H10K 71/00 |
| 2017/0279075 A1* | 9/2017 | Chen | ............... | H10K 50/844 |
| 2018/0040842 A1* | 2/2018 | Wu | ............... | H01L 27/15 |
| 2018/0108857 A1* | 4/2018 | Adachi | ............... | H10K 50/15 |
| 2018/0190740 A1* | 7/2018 | Bang | ............... | H10K 50/856 |
| 2018/0212181 A1* | 7/2018 | Wang | ............... | H10K 50/816 |
| 2018/0212201 A1* | 7/2018 | Bai | ............... | H10K 50/15 |
| 2018/0233705 A1* | 8/2018 | Xu | ............... | H01L 23/28 |
| 2018/0294423 A1* | 10/2018 | Toyoda | ............... | H10K 50/818 |
| 2018/0331320 A1* | 11/2018 | Su | ............... | H10K 50/844 |
| 2019/0035865 A1* | 1/2019 | Cui | ............... | H10K 50/171 |
| 2019/0067394 A1* | 2/2019 | Cheon | ............... | G09G 3/3225 |
| 2019/0067617 A1* | 2/2019 | Tanaka | ............... | H10K 59/30 |
| 2019/0067625 A1* | 2/2019 | Yu | ............... | H10K 50/813 |
| 2019/0088728 A1* | 3/2019 | Wu | ............... | H10K 50/82 |
| 2019/0097158 A1* | 3/2019 | Sakamoto | ............... | H01L 27/1255 |
| 2019/0172874 A1* | 6/2019 | Lim | ............... | H10K 59/35 |
| 2019/0229157 A1* | 7/2019 | Kuang | ............... | H10K 50/818 |
| 2019/0280062 A1* | 9/2019 | Ma | ............... | H10K 59/35 |
| 2019/0288227 A1* | 9/2019 | Kojima | ............... | H10K 50/8426 |
| 2019/0312234 A1* | 10/2019 | Liu | ............... | H10K 59/122 |
| 2019/0334125 A1* | 10/2019 | Hosono | ............... | H10K 71/00 |
| 2019/0386071 A1* | 12/2019 | Xia | ............... | H10K 59/32 |
| 2020/0058717 A1 | 2/2020 | Song et al. | | |
| 2020/0058896 A1* | 2/2020 | Wang | ............... | H10K 50/865 |
| 2020/0075879 A1* | 3/2020 | Luo | ............... | H10K 77/111 |
| 2020/0152711 A1* | 5/2020 | Liu | ............... | H10K 50/852 |
| 2020/0212143 A1* | 7/2020 | Jeong | ............... | H10K 71/221 |
| 2020/0235332 A1* | 7/2020 | Kobayashi | ............... | H10K 50/818 |
| 2020/0303470 A1* | 9/2020 | Hsu | ............... | H10K 59/128 |
| 2021/0013439 A1* | 1/2021 | Sado | ............... | H10K 50/11 |
| 2021/0028327 A1* | 1/2021 | Lin | ............... | H10K 59/38 |
| 2021/0155849 A1* | 5/2021 | Stubbs | ............... | C09K 11/025 |
| 2021/0159289 A1* | 5/2021 | Liu | ............... | H10K 59/122 |
| 2021/0167319 A1* | 6/2021 | Quan | ............... | H10K 59/35 |
| 2021/0217830 A1* | 7/2021 | Huangfu | ............... | H10K 59/122 |
| 2021/0225949 A1* | 7/2021 | Zhang | ............... | H10K 59/30 |
| 2021/0233966 A1* | 7/2021 | Xu | ............... | H10K 50/85 |
| 2021/0328193 A1* | 10/2021 | Gong | ............... | H10K 71/00 |
| 2021/0335961 A1* | 10/2021 | Hou | ............... | H01L 25/0657 |
| 2021/0340137 A1* | 11/2021 | Wang | ............... | H10K 85/40 |
| 2021/0367184 A1* | 11/2021 | Song | ............... | H10K 59/122 |
| 2021/0408447 A1* | 12/2021 | Luo | ............... | H10K 59/8722 |
| 2022/0006040 A1* | 1/2022 | Arakawa | ............... | H10K 50/828 |
| 2022/0037432 A1* | 2/2022 | Xu | ............... | H10K 50/856 |
| 2022/0077250 A1* | 3/2022 | Tang | ............... | H10K 50/818 |
| 2022/0077251 A1* | 3/2022 | Choung | ............... | H10K 59/173 |
| 2022/0077252 A1* | 3/2022 | Choung | ............... | H10K 59/122 |
| 2023/0091271 A1* | 3/2023 | Ohshima | ............... | H10K 59/122 |
| | | | | 257/91 |
| 2023/0092444 A1* | 3/2023 | Wu | ............... | H10K 85/6572 |
| | | | | 257/40 |
| 2023/0105154 A1* | 4/2023 | Sun | ............... | H10K 50/865 |
| | | | | 257/40 |
| 2023/0105196 A1* | 4/2023 | Ohshima | ............... | H01L 25/0756 |
| | | | | 257/89 |
| 2023/0109132 A1* | 4/2023 | Du | ............... | H10K 59/122 |
| | | | | 438/107 |
| 2023/0352517 A1* | 11/2023 | Ohshima | ............... | H01L 33/60 |
| 2023/0354674 A1* | 11/2023 | Fukuda | ............... | H10K 50/16 |

FOREIGN PATENT DOCUMENTS

| | | |
|---|---|---|
| CN | 107170904 A | 9/2017 |
| CN | 109065597 A | 12/2018 |
| CN | 111697162 A | 9/2020 |
| CN | 216054781 U | 3/2022 |

* cited by examiner

DISPLAY SUBSTRATE AND DISPLAY DEVICE

CROSS-REFERENCE TO RELATED APPLICATION

This application claims a priority of the Chinese patent application No. 202110347900.3 filed in China on Mar. 31, 2021, which is incorporated herein by reference in its entirety.

TECHNICAL FIELD

The present disclosure relates to the field of display technology, in particular to a display substrate and a display device.

BACKGROUND

Organic Light-Emitting Diode (OLED) display device has become a most promising next-generation display technology due to such advantages as being thin, being light, a wide view angle, self-luminescence, a continuously-adjusted color, low cost, rapid response, low power consumption, low driving voltage, wide operating temperature range, simple manufacture process, high luminous efficiency and flexible display.

SUMMARY

An object of the present disclosure is to provide a display substrate and a display device, so as to solve problems in the related art.

In one aspect, the present disclosure provides in some embodiments a display substrate, including: a base substrate; and a light-emitting element arranged on the base substrate, and including a first electrode, an organic functional layer and a second electrode arranged sequentially in that order in a direction away from the base substrate. The light-emitting element includes a first surface proximate to the base substrate, a second surface distal to the base substrate, and a side surface arranged between the first surface and the second surface. The display substrate further includes a reflection layer covering at least a part of the side surface and configured to reflect light from the organic functional layer.

In a possible embodiment of the present disclosure, an angle between a line tangent to a surface of the reflection layer proximate to the light-emitting element and a line tangent to a surface of the first electrode distal to the base substrate is smaller than 90°.

In a possible embodiment of the present disclosure, a thickness of the reflection layer in a direction parallel to the base substrate is greater than or equal to 50 nm and smaller than or equal to 100 nm.

In a possible embodiment of the present disclosure, the reflection layer is made of a conductive material and covers only a part of the side surface.

In a possible embodiment of the present disclosure, the reflection layer includes a first reflection pattern in contact with the first electrode and a second reflection pattern in contact with the second electrode, and an insulation pattern is arranged between the first reflection pattern and the second reflection pattern.

In a possible embodiment of the present disclosure, the organic functional layer includes a hole injection layer, a hole transport layer, a light-emitting layer, a hole blocking layer, an electron transport layer and an electron injection layer laminated one on another in that order in the direction away from the base substrate, the first reflection pattern is insulated from the hole blocking layer, and the second reflection pattern is insulated from the hole transport layer.

In a possible embodiment of the present disclosure, the light-emitting layer and the insulation pattern are formed integrally.

In a possible embodiment of the present disclosure, an orthogonal projection of the hole transport layer onto the base substrate is located within an orthogonal projection of the hole injection layer onto the base substrate, the hole injection layer covers a side surface of the hole transport layer, and the hole transport layer is not in contact with the first reflection pattern. An orthogonal projection of the light-emitting layer onto the base substrate is located within the orthogonal projection of the hole transport layer onto the base substrate, the hole transport layer covers a part of a side surface of the light-emitting layer, and the light-emitting layer is not in contact with the first reflection pattern.

In a possible embodiment of the present disclosure, the orthogonal projection of the hole injection layer onto the base substrate is located within an orthogonal projection of the first electrode onto the base substrate, the first electrode covers a side surface of the hole injection layer, and the hole injection layer is not in contact with the first reflection pattern.

In a possible embodiment of the present disclosure, the orthogonal projection of the light-emitting layer onto the base substrate is located within the orthogonal projection of the hole blocking layer onto the base substrate, the orthogonal projection of the hole blocking layer onto the base substrate is located within the orthogonal projection of the electron transport layer onto the base substrate, the electron transport layer covers a side surface of the hole blocking layer, and the hole blocking layer is not in contact with the second reflection pattern.

In a possible embodiment of the present disclosure, the orthogonal projection of the electron transport layer onto the base substrate is located within the orthogonal projection of the electron injection layer onto the base substrate, the electron injection layer covers a side surface of the electron transport layer, and the side surface of the electron transport layer is not in contact with the second reflection pattern.

In a possible embodiment of the present disclosure, the orthogonal projection of the electron injection layer onto the base substrate is located within an orthogonal projection of the second electrode onto the base substrate, the second electrode covers a side surface of the electron injection layer, and the side surface of the electron injection layer is not in contact with the second reflection pattern.

In a possible embodiment of the present disclosure, the display substrate further includes a light extraction layer arranged at a light-exiting side of the light-emitting element, and a refractive index of the light extraction layer is smaller than a refractive index of the base substrate.

In a possible embodiment of the present disclosure, the light extraction layer is of a single-layered structure having a refractive index gradually decreasing in a light emergent direction, and the light emergent direction is a direction in which the light extraction layer faces away from the organic functional layer; or the light extraction layer is made of a spherical molecular material; or the light extraction layer is provided with a plurality of hemispherical micro-structures arranged in an array form at a side surface proximate to the light-emitting element.

In a possible embodiment of the present disclosure, the light extraction layer is made of a first refractive material having a first refractive index and a second refractive material having a second refractive index, and the first refractive index of the first refractive material is greater than the second refractive index of the second refractive material, wherein in the light extraction layer, in a direction away from the light-emitting element, a content of the first refractive material gradually decreases and a content of the second refractive material gradually increases, so that a refractive index of the light extraction layer gradually decreases in a light emergent direction.

In another aspect, the present disclosure provides in some embodiments a display device, including the above-mentioned display substrate and a driving chip.

Figure 1:
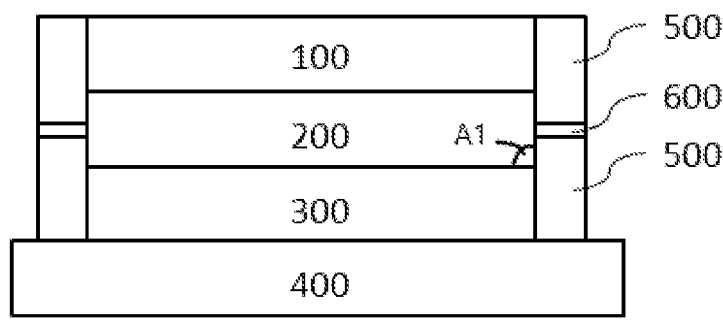
FIGS. 1 and 2 are sectional views of a display substrate according to an embodiment of the present disclosure.

REFERENCE SIGN LIST 100 second electrode
200 organic function layer
300 first electrode
400 base substrate
500 reflection layer
600 insulation pattern
700 light extraction layer
800 light-emitting region
201 hole injection layer HIL
202 hole transport layer HTL
203 light-emitting layer EML
204 hole blocking layer HBL
205 electron transport layer ETL
206 hole injection layer EIL
501 first reflection pattern
502 second reflection pattern

DETAILED DESCRIPTION

In order to make the objects, the technical solutions and the advantages of the present disclosure more apparent, the present disclosure will be described hereinafter in a clear manner in conjunction with the drawings and embodiments.

Generally, light-emitting devices include OLED devices each having a light-emitting layer made of an organic material and inorganic light-emitting devices each having a light-emitting layer made of an inorganic material. Organic luminescence refers to a phenomenon where electric energy is converted by an organic material into optical energy. When an appropriate organic material layer is arranged between a first electrode and a second electrode and a voltage is applied between the two electrodes, holes are injected from the first electrode into the organic material layer, and electrons are injected from the second electrode into the organic material layer. When the holes meet the electrons, excitons are generated, and when the excitons fall down to be in a ground state, light is generated. The OLED display device has a series of advantages, such as low driving voltage, wide viewing angle, high resolution, rapid response and excellent natural color reproduction.

However, merely about 20% of the light generated by an OLED exits from the OLED device, so the luminous efficiency of a display substrate is required to be improved.

An object of the present disclosure is to provide a display substrate and a display device, so as to improve the luminous efficiency of the display substrate.

The present disclosure provides in some embodiments a display substrate which, as shown in FIG. 1, includes: a base substrate 400 provided with a driving circuitry layer; a pixel definition layer arranged on the base substrate 400 and configured to define a plurality of aperture regions; and a light-emitting element arranged in each aperture region, and including a first electrode 300, an organic functional layer 200 and a second electrode 100 arranged sequentially in that order in a direction away from the base substrate 400. The light-emitting element includes a first surface proximate to the base substrate 400, a second surface distal to the base substrate 400, and a side surface arranged between the first surface and the second surface. The display substrate further includes a reflection layer 500 covering at least a part of the side surface and configured to reflect light from the organic functional layer 200.

According to the embodiments of the present disclosure, the display substrate includes the reflection layer 500 covering the side surface of the light-emitting element, and lateral light from the light-emitting element is reflected by the reflection layer 500 toward a display side. As a result, it is able to reduce a loss of the lateral light, thereby to improve the luminous efficiency of the display substrate.

In the embodiments of the present disclosure, the display substrate is an OLED display substrate, a Quantum-dot Light-Emitting Diode (QLED) display substrate, a Mini-LED display substrate, a Micro-LED display substrate, etc.

The base substrate may be a glass substrate, a quartz substrate or a silicon substrate. In addition, it may also be a flexible substrate, e.g., a polyimide thin film. When the base substrate is the glass, quartz or flexible substrate, it further includes a thin film transistor array layer arranged on the glass, quartz or flexible substrate. When the base substrate is the silicon substrate, the driving circuitry layer is integrated in the silicon substrate.

In the embodiments of the present disclosure, the first electrode 300 is one of an anode and a cathode, and the second electrode 100 is the other one of the anode and the cathode. The second electrode 100 is a metal layer having a reflection characteristic. The first electrode 300 is an ultra-thin conductive layer having a light-transmitting characteristic, and it is made of, but not limited to, Indium Tin Oxide (ITO).

Due to the reflection characteristic of the second electrode 100, light from the organic functional layer 200 is reflected by the second electrode 100 to pass through the organic functional layer 200, and pass through the transparent first electrode 300 and then pass through the transparent base substrate 400, to emit the visible light.

However, not all the light generated by the organic functional layer 200 passes through the base substrate 400. The light is transmitted in all directions from an optical source, and merely a part of the light passes through the base substrate 400. Some light passes through a side surface of the organic functional layer 200 and then is propagated inside the display substrate, rather than passing through the base substrate 400, so a light loss occurs. In this regard, in the case of the loss of the light from the organic functional layer 200 due to, e.g., a waveguide effect, the luminous efficiency of the display substrate is merely about 20%.

In the embodiments of the present disclosure, through the reflection layer 500 at the side surface of the light-emitting element, the part of light that passes through the side surface and should have been lost is reflected to the base substrate 400, so as to improve the luminous efficiency, and reduce the light loss at the side surface of the organic functional layer 200. The reflection layer 500 is made of, but not limited to, one or more of nontransparent metals having high reflectivity, e.g., copper (Cu), silver (Ag) and gold (Au).

Figure 2:
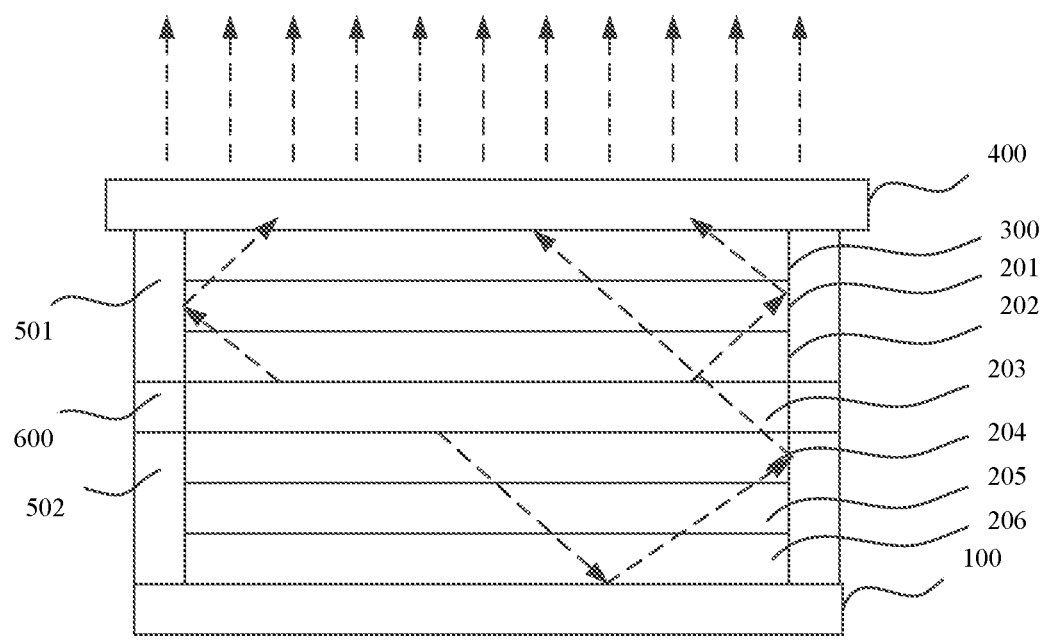

As shown in FIG. 2, the organic functional layer 200 includes a hole injection layer 201, a hole transport layer 202, a light-emitting layer 203, a hole blocking layer 204, an electron transport layer 205 and an electron injection layer 206 laminated one on another in that order in a direction away from the base substrate 400. During the operation of the display substrate, holes are injected from the first electrode 300 into the light-emitting layer 203, and electrons are injected from the second electrode 100 into the light-emitting layer 203. When the holes meet the electrons, excitons are generated in the light-emitting layer 203, and the light-emitting layer 203 is excited to emit light. A dotted line in FIG. 2 indicates a propagation direction of the light emitted by the light-emitting layer 203. The light from the light-emitting layer 203 may be propagated in a direction away from the base substrate 400 or toward the base substrate 400, or in a lateral direction. The light propagated in the lateral direction is reflected by the reflection layer 500 toward a display side (i.e., a side away from the base substrate 400). The light propagated toward the base substrate 400 is reflected by the base substrate 400 to the reflection layer 500 and then reflected by the reflection layer 500 to the display side. In this way, it is able to improve the luminous efficiency of the display substrate.

In the embodiments of the present disclosure, the reflection layer 500 covers a part of, or all of, the side surface of the light-emitting element. The larger the area of the reflection layer 500, the more the light to be reflected, and the larger the luminous efficiency of the display substrate.

The reflection layer 500 is made of an insulation material, and at this time, it covers all of the side surface of the light-emitting element. The reflection layer 500 may also be made of a conductive material, e.g., a conductive metal, and at this time, in order to prevent the occurrence of a short circuit between the second electrode 100 and the first electrode 300 when the first electrode 300 is electrically coupled to the second electrode 100 through the reflection layer 500, the reflection layer 500 does not cover an entirety of the side surface.

As shown in FIGS. 1 and 2, when the reflection layer 500 is made of a conductive material, it includes a first reflection pattern 501 in contact with the first electrode 300 and a second reflection pattern 502 in contact with the second electrode 100. An insulation pattern 600 is arranged between the first reflection pattern 501 and the second reflection pattern 502, so as to prevent the first electrode 300 from being electrically coupled to the second electrode 100. In order to increase the area of the reflection layer 500, in the embodiments of the present disclosure, the reflection layer 500 includes the first reflection pattern 501 and the second reflection pattern 502, and the insulation pattern 600 is configured to isolate the first reflection pattern 501 from the second reflection pattern 502. In this way, it is able for the reflection layer 500 to cover a majority of the side surface of the light-emitting element.

When the reflection layer 500 is made of a conductive material, the first reflection pattern 501 is electrically coupled to the first electrode 300 so as to transport the holes, and the second reflection pattern 502 is electrically coupled to the second electrode 100 so as to transport the electrons. Through the first reflection pattern 501, it is able to indirectly increase a contact area between the first electrode 300 and the organic functional layer 200, and through the second reflection pattern 502, it is able to indirectly increase a contact area between the second electrode 100 and the organic functional layer 200. In this way, it is able to facilitate the injection of carriers into the organic functional layer 200, and increase a concentration of the excitons obtained through the combination of the carriers in the light-emitting layer 203, thereby to further increase the luminescence property of the display substrate.

In the embodiments of the present disclosure, the insulation pattern 600 is made of an organic insulation material, e.g., an acrylic resin, or made of an inorganic insulation material, e.g., silicon nitride or silicon oxide, as long as the first reflection pattern 501 is insulated from the second reflection pattern 502.

In the embodiments of the present disclosure, during the formation of the reflection layer 500 and the light-emitting element, film layers are formed through thermal vapor deposition in a vacuum chamber. To be specific, the first electrode 300, the hole injection layer 201 and the hole transport layer 202 are evaporated through a fine metal mask. Next, the first reflection pattern 501, the light-emitting layer 203 and the insulation pattern 600 are formed. Then, the hole blocking layer 204, the electron transport layer 205, the electron injection layer 206 and the second reflection pattern 502 are formed. Finally, the second electrode 100 is formed through evaporation. The second electrode 100 is a surface-like electrode covering an entire display region of the display substrate.

In the embodiments of the present disclosure, due to the reflection characteristic of the second electrode 100 and the reflection layer 500, the second electrode 100 and the reflection layer 500 are made of a same material, e.g., Ag or Mg. In this way, the second electrode 100 and the reflection layer 500 are formed through a same film-forming device, and as compared with an existing device for manufacturing the display substrate, it is able to form the reflection layer 500 without any new film-forming device.

During molecular diffusion in the vapor deposition, in the display substrate, an interface between the reflection layer 500 and the organic functional layer 200 is tilted to some extent, so that an angle A1 between a line tangent to a surface of the reflection layer proximate to the light-emitting element and a line tangent to a surface of the first electrode distal to the base substrate is smaller than 90°. In this way, it is able to help the reflected light to pass through the first electrode 300.

When a thickness of the reflection layer 500 is too small, e.g., smaller than 50 nm, a certain amount of light is allowed to pass through the reflection layer 500, so the reflection property of the reflection layer 500 is adversely affected, and thereby the luminous efficiency of the display substrate is adversely affected. When the thickness of the reflection layer 500 is too large, e.g., larger than 100 nm, the deposition of the film layers of the light-emitting element is adversely affected because the reflection layer 500 is arranged at a pixel region. For example, the thickness of the reflection layer 500 in a direction parallel to the base substrate is greater than or equal to 50 nm, e.g., 50 nm to 100 nm, so as to ensure the reflection performance of the reflection layer 500 as well as the performance of the light-emitting element.

Figure 3:
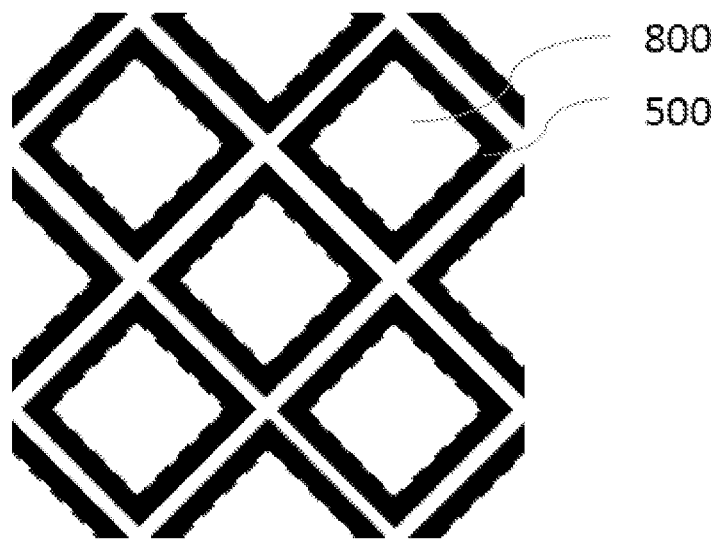
FIG. 3 is a planar view of the display substrate according to an embodiment of the present disclosure.

FIG. 3 is a planar view of the display substrate. As shown in FIG. 3, the reflection layer 500 surrounds a light-emitting region, so as to reflect the lateral light from the light-emitting region. In FIG. 3, the light-emitting region is of a square shape. However, the light-emitting region may also be of any other shapes, e.g., circular, hexagonal or the other irregular shape.

In a possible embodiment of the present disclosure, as shown in FIG. 2, the organic functional layer 200 includes a hole injection layer 201, a hole transport layer 202, a light-emitting layer 203, a hole blocking layer 204, an electron transport layer 205 and an electron injection layer 206 laminated one on another in that order in a direction away from the base substrate 400. The first reflection pattern 501 extends from the first electrode 300 to the hole transport layer 202 and is insulated from the hole blocking layer 204. The second reflection pattern 502 extends from the electron injection layer 206 to the hole blocking layer 204 and is insulated from the hole transport layer 202. In this way, it is able to prevent the holes from being transported to the hole blocking layer 204 through the first reflection pattern 501 across the light-emitting layer 203, and prevent the electrons from being transported to the hole transport layer 202 through the second reflection pattern 502 across the light-emitting layer 203, thereby to prevent the normal operation of the light-emitting element from being adversely affected.

Figure 4:
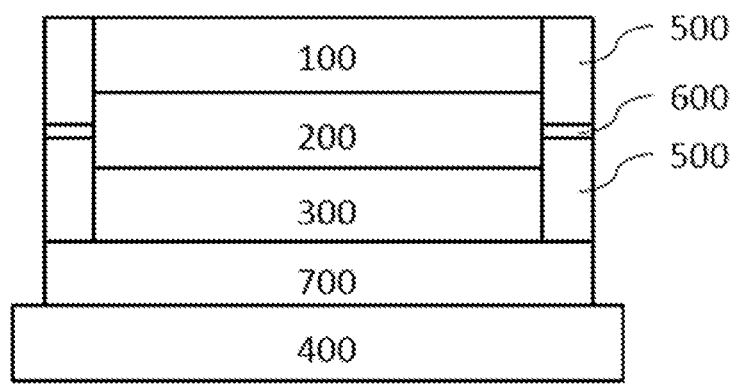
FIGS. 4 to 11 are sectional views of the display substrate according to an embodiment of the present disclosure.

In some embodiments of the present disclosure, as shown in FIG. 4, the display substrate further includes a light extraction layer 700 arranged at a light-exiting side of the light-emitting element and having a refractive index smaller than the base substrate 400. Through the light extraction layer 700, it is able to reduce full reflection and increase the light extraction, thereby to further improve the luminous efficiency of the display substrate.

In some embodiments of the present disclosure, the light extraction layer 700 is of a single-layered structure having a refractive index gradually decreasing in a light emergent direction, and the light emergent direction is a direction in which the light extraction layer 700 faces away from the light-emitting layer 203.

In the embodiments of the present disclosure, when the refractive index of the light extraction layer 700 gradually decreases in the light emergent direction, it is able to adjust wide-angle interference and multi-beam interference, thereby to improve the light extraction of the display substrate and enlarge a viewing angel. In addition, as compared with a situation where the light extraction layer 700 is of a multi-layered structure having a refractive index gradually decreasing in a stepwise manner and the light loss occurs at an interface between the layers, in the embodiments of the present disclosure, the light extraction layer 700 is of a single-layered structure having a refractive index gradually decreasing in the light emergent direction, i.e., the light extraction layer 700 is not provided with any interface between layers having different refractive indices in the light emergent direction. As a result, it is able to prevent the occurrence of the light loss at the interface between the layers of the light extraction layer 700, thereby to further improve the light extraction of the OLED device.

Here, it should be appreciated that, when the light extraction layer 700 is of a single-layered structure having a refractive index gradually decreasing in the light emergent direction, it means that the refractive index of the light extraction layer 700 gradually decreases in the light emergent direction but there is no interface between regions with different refractive indices.

Based on the above, because the refractive index of the light extraction layer 700 gradually decreases, in actual use, the light extraction layer 700 needs to be made of at least two kinds of materials having different refractive indices.

Here, it should be appreciated that, the light extraction layer 700 is made of an inorganic compound, e.g., an inorganic material having a high refractive index such as ZnO, ZnS, ZnSe, $TeO_2$, $WO_3$, $MoO_3$, MgO or LiF. In addition, the light extraction layer 700 may also be made of an organic compound, e.g., an organic material having a high refractive index such as $Alq_3$, $Liq_3$, MeO-TPD or BCP. It should be noted that, in actual use, two of the above-mentioned inorganic compounds or two of the above-mentioned organic compounds may be selected, or one inorganic compound and one organic compound may be selected, which will not be particularly defined herein.

For example, the light extraction layer 700 includes, in the thickness direction, a material having a first refractive index and with its content decreasing gradually in the light emergent direction and a material having a second refractive index and with its content increasing gradually in the light emergent direction. The first refractive index is greater than the second refractive index. In this way, it is able to form the light extraction layer 700 which is of a single-layered structure having a refractive index gradually decreasing in the light emergent direction.

It should be appreciated that, the content of each of the material having the first refractive index and the material having the second refractive index is a weight percentage.

Here, it should be appreciated that, the content of the material having the larger first refractive index in the light extraction layer 700 gradually decreases in the light emergent direction, and the content of the material having the smaller second refractive index in light extraction layer 700 gradually increases in the light emergent direction. In other words, the entire light extraction layer 700 is of a single-layered structure, and in the light emergent direction, the content of the material having a larger refractive index gradually decreases, while the content of the material having a smaller refractive index gradually increases, so that the refractive index of the single-layered light extraction layer 700 decreases gradually in the light emergent direction.

In a possible embodiment of the present disclosure, a difference between the refractive index of a portion of the light extraction layer 700 in contact with the first electrode and the refractive index of a portion of the light extraction layer 700 distal to the first electrode is greater than or equal to 0.1. It should be appreciated that, the refractive index of the portion of the light extraction layer 700 distal to the first electrode is necessarily greater than a refractive index of air.

To be specific, in the case that the difference between the refractive index N1 of the portion of the light extraction layer 700 in contact with the first electrode and the refractive index N2 of the portion of the light extraction layer 700 distal to the first electrode is smaller than 0.1, i.e., 0<N1−N2<0.1, it is necessary to adjust the wide angle interference and the multi-beam interference to a relatively small extent due to the too small difference between the refractive indices, thereby the light extraction of the display substrate and the viewing angle are increased in a limited manner. Hence, in a possible embodiment of the present disclosure, the difference between the refractive index of the portion of the light extraction layer 700 in contact with the first electrode and the refractive index of the portion of the light extraction layer 700 distal to the first electrode is greater than or equal to 0.1.

Based on the above, in a possible embodiment of the present disclosure, the thickness of the light extraction layer is 20 nm to 500 nm.

To be specific, when the thickness of the light extraction layer is smaller than 20 nm, a manufacture process is highly demanded due to the too small thickness (while the above-mentioned condition where the refractive index gradually decreases needs to be met), and meanwhile it is unable to adjust the wide angle interference and the multi-beam interference obviously. When the thickness of the light extraction layer is too large, e.g., greater than 500 nm, unnecessary waste occurs, and meanwhile it is adverse to the design of a light and thin product. Hence, in a possible embodiment of the present disclosure, the thickness of the light extraction layer is within the range of 20 nm to 500 nm, with 20 nm and 500 nm being inclusive.

In addition, it should be appreciated that, in order to enable the light extraction layer to adjust the wide angle interference and the multi-beam interference as possible, in actual use, the appropriate thickness of the light extraction layer may be selected within the above-mentioned range in accordance with an actual beam (e.g., a wavelength) and the range of the refractive index of the light extraction layer.

In some embodiments of the present disclosure, the light extraction layer 700 is made of a spherical molecular material, e.g., C70. Through a molecule packing mode of C70 itself, the light extraction layer 700 is provided with a micro-nano structure, so as to reduce the full reflection of the display substrate and improve the light extraction.

C70 is a spherical molecule having a special structure, and when it is deposited on the base substrate, a fine micro-nano structure is formed. The fine micro-nano structure is similar to a micro-lens or a scattering layer having many micro-spheres, a roughness level of a thin film further increases. When the light extraction layer 700 is made of C70, it is able to reduce an incident angle of the light which should have been greater than a critical angle, thereby to reduce the full reflection of the emergent light and improve the light extraction. In addition, the light extraction layer 700 has relatively large transmittance within the entire visible light range, so it is able to prevent the light extraction layer 700 from absorbing the generated photons too much. Through the packing mode of C70 itself, it is able to provide the light extraction layer 700 with a fine micro-nano structure, so as to reduce the full reflection and increase the light extraction.

Figure 5:
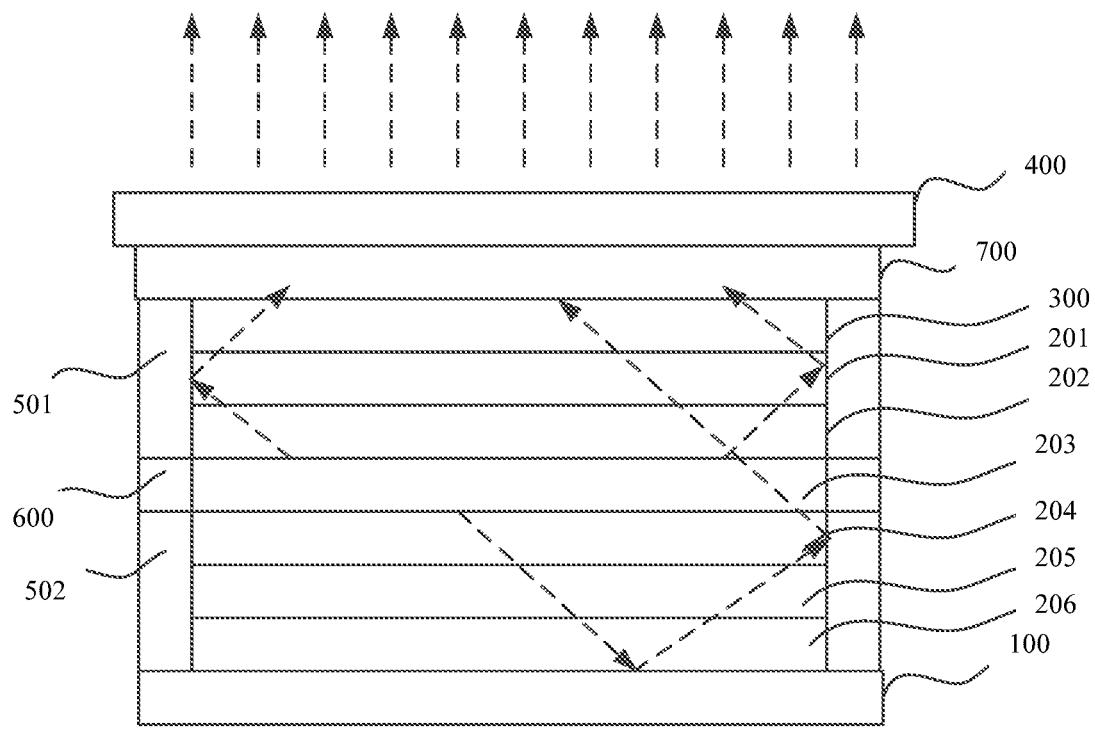

In some embodiments of the present disclosure, the light extraction layer 700 is provided with a plurality of hemi-spherical micro-structures arranged in an array form at a side surface proximate to the light-emitting element. To be specific, the light extraction layer 700 is provided with a plurality of nano-level micro-structures arranged in an array form at a side surface proximate to the light-emitting element, and each micro-structure is of a hemispherical shape. It should be noted that, the micro-structure may also be of any other shape, e.g., a hemi-ellipsoidal shape. Through the hemispherical micro-structure, it is able to, on one hand, reduce the full reflection and increase the light extraction, and on the other hand, change a propagation direction of the light. As shown in FIG. 5, when the light from the light-emitting layer 203 reaches the light extraction layer 700, the propagation direction of a majority of the light is angled relative to the base substrate 400 at an angle smaller than 90°. In the embodiments of the present disclosure, through the hemispherical micro-structure, it is able to change the propagation direction of the light to be perpendicular to the base substrate 400, thereby to increase the removal of forward light, and optimize a display effect of the display substrate.

Figure 6:
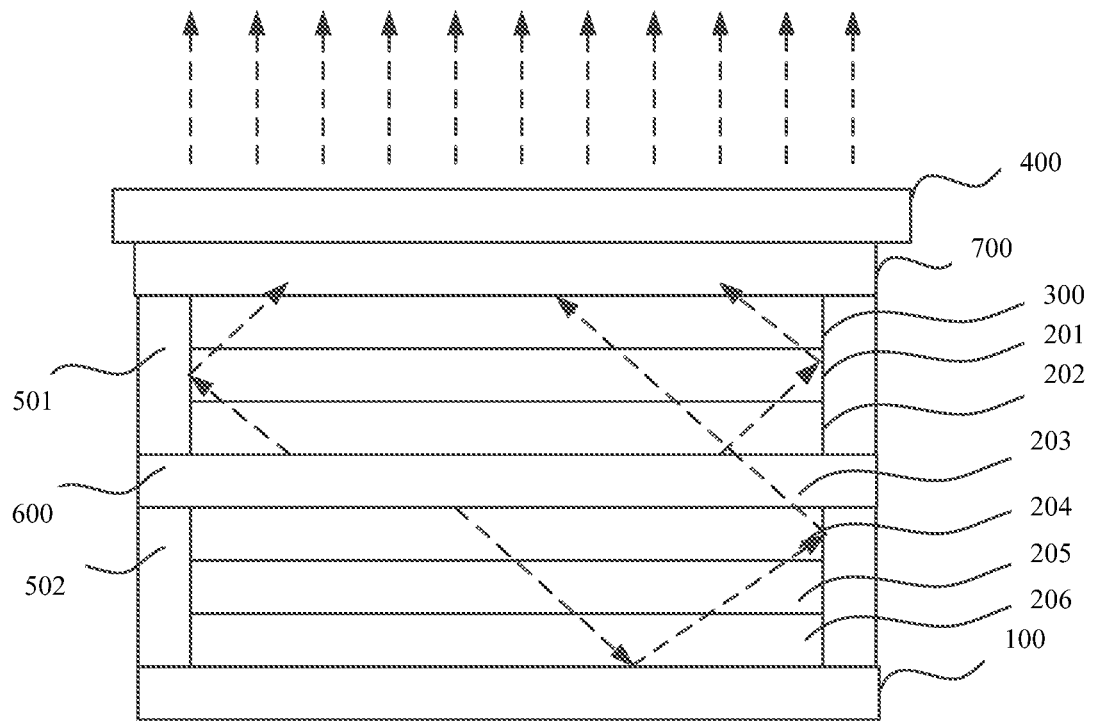

In some embodiments of the present disclosure, as shown in FIG. 6, the organic functional layer 200 includes a hole injection layer 201, a hole transport layer 202, a light-emitting layer 203, a hole blocking layer 204, an electron transport layer 205 and an electron injection layer 206 laminated one on another in a direction away from the base substrate 400, and the light-emitting layer 203 is formed integrally with the insulation pattern 600, so as to simplify the structure of the display substrate, increase a contact area between the light-emitting layer 203 and each of the first reflection pattern 501 and the second reflection pattern 502, and increase a concentration of excitons obtained through the combination of carriers in the light-emitting layer 203, thereby to further improve the luminescence performance of the display substrate.

Figure 7:
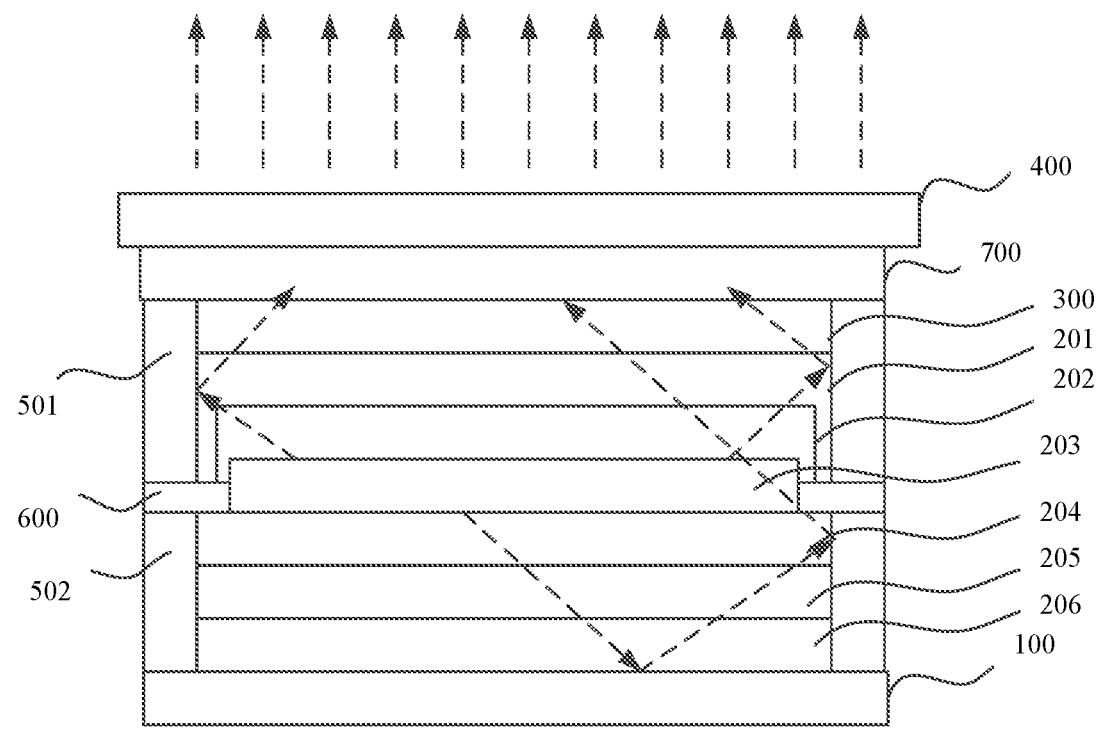

In some embodiments of the present disclosure, as shown in FIG. 7, the organic functional layer 200 includes a hole injection layer 201, a hole transport layer 202, a light-emitting layer 203, a hole blocking layer 204, an electron transport layer 205 and an electron injection layer 206 laminated one on another in a direction away from the base substrate 400. An orthogonal projection of the hole transport layer 202 onto the base substrate 400 is located within an orthogonal projection of the hole injection layer 201 onto the base substrate 400, the hole injection layer 201 covers a side surface of the hole transport layer 202, and the hole transport layer 202 is not in contact with the first reflection pattern 501. An orthogonal projection of the light-emitting layer 203 onto the base substrate 400 is located within the orthogonal projection of the hole transport layer 202 onto the base substrate 400, the hole transport layer 202 covers a part of the side surface of the light-emitting layer 203, and the light-emitting layer 203 is not in contact with the first reflection pattern 501. As shown in FIG. 7, in the embodiments of the present disclosure, based on the above-mentioned structure of the display substrate, it is able to increase a contact area between the hole injection layer 201 and the first reflection pattern 501, indirectly increase a contact area between the hole injection layer 201 and the first electrode 300, increase the quantity of holes, and increase the concentration of the excitons obtained through the combination of the carriers in the light-emitting layer 203, thereby to further improve the luminescence performance of the display substrate.

Figure 8:
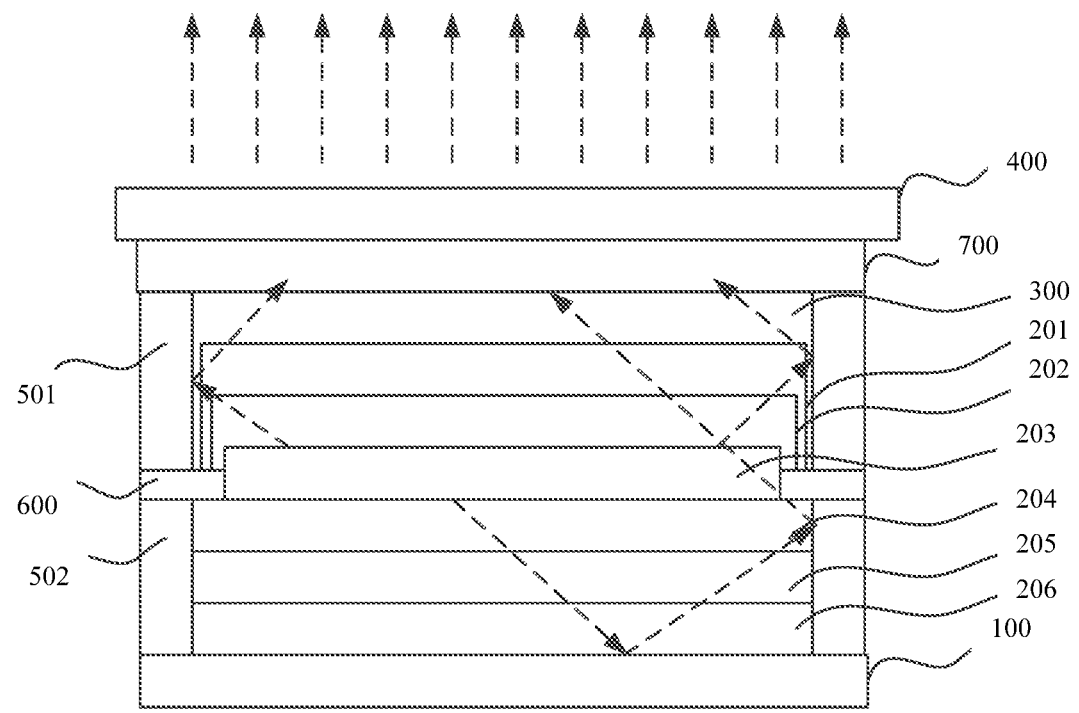

In some embodiments of the present disclosure, as shown in FIG. 8, the organic functional layer 200 includes a hole injection layer 201, a hole transport layer 202, a light-emitting layer 203, a hole blocking layer 204, an electron transport layer 205 and an electron injection layer 206 laminated one on another in a direction away from the base substrate 400. An orthogonal projection of the hole injection layer 201 onto the base substrate 400 is located within an orthogonal projection of the first electrode 300 onto the base substrate 400, the first electrode 300 covers a side surface of the hole injection layer 201, and the hole injection layer 201 is not in contact with the first reflection pattern 501. As shown in FIG. 8, in the embodiments of the present disclosure, based on the above-mentioned structure of the display substrate, it is able to increase a contact area between the hole injection layer 201 and the first electrode 300, increase the quantity of holes, and increase the concentration of the excitons obtained through the combination of the carriers in the light-emitting layer 203, thereby to further improve the luminescence performance of the display substrate.

Figure 9:
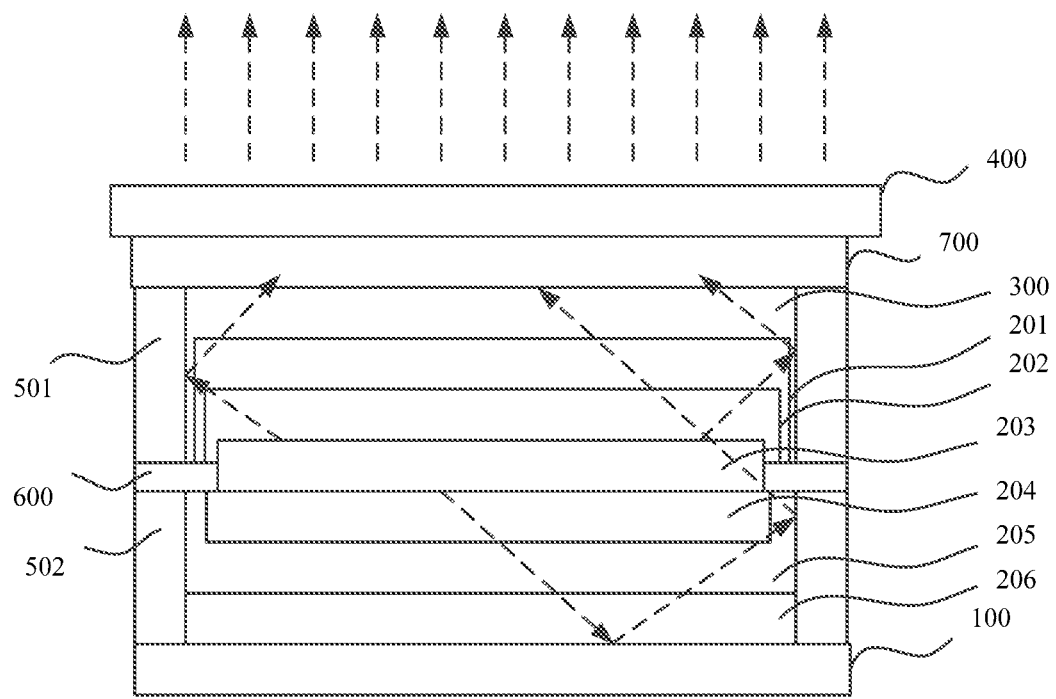

In some embodiments of the present disclosure, as shown in FIG. 9, the organic functional layer 200 includes a hole injection layer 201, a hole transport layer 202, a light-emitting layer 203, a hole blocking layer 204, an electron transport layer 205 and an electron injection layer 206 laminated one on another in a direction away from the base substrate 400. An orthogonal projection of the light-emitting layer 203 onto the base substrate 400 is located within an orthogonal projection of the hole blocking layer 204 onto the base substrate 400, the orthogonal projection of the hole blocking layer 204 onto the base substrate 400 is located within an orthogonal projection of the electron transport layer 205 onto the base substrate 400, the electron transport layer 205 covers a side surface of the hole blocking layer 204, and the hole blocking layer 204 is not in contact with the second reflection pattern 502. As shown in FIG. 9, in the embodiments of the present disclosure, based on the above-mentioned structure of the display substrate, it is able to increase a contact area between the electron transport layer 205 and the second reflection pattern, indirectly increase a contact area between the electron transport layer 205 and the second electrode 100, increase the quantity of electrons, and increase the concentration of the excitons obtained through the combination of the carriers in the light-emitting layer 203, thereby to further improve the luminescence performance of the display substrate.

Figure 10:
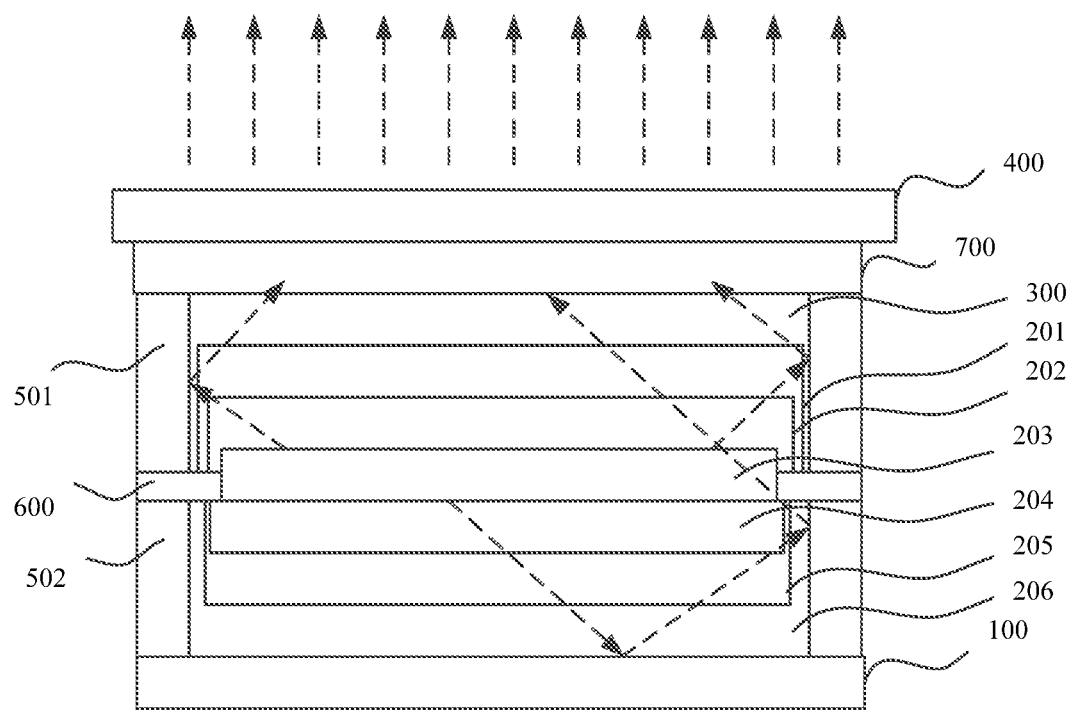

In some embodiments of the present disclosure, as shown in FIG. 10, the organic functional layer 200 includes a hole injection layer 201, a hole transport layer 202, a light-emitting layer 203, a hole blocking layer 204, an electron transport layer 205 and an electron injection layer 206 laminated one on another in a direction away from the base substrate 400. An orthogonal projection of the electron transport layer 205 onto the base substrate 400 is located within an orthogonal projection of the electron injection layer 206 onto the base substrate 400, the electron injection layer 206 covers a side surface of the electron transport layer 205, and the side surface of the electron transport layer 205 is not in contact with the second reflection pattern 502. In this way, it is able to increase a contact area between the electron injection layer 206 and the second reflection pattern 502, indirectly increase a contact area between the electron injection layer 206 and the second electrode 100, increase the quantity of electrons, and increase the concentration of the excitons obtained through the combination of the carriers in the light-emitting layer 203, thereby to further improve the luminescence performance of the display substrate.

In some embodiments of the present disclosure, the orthogonal projection of the electron injection layer 206 onto the base substrate 400 is located within the orthogonal projection of the second electrode 100 onto the base substrate 400, the second electrode covers a side surface of the electron injection layer 206, and the side surface of the electron injection layer 206 is not in contact with the second reflection pattern. In this way, it is able to directly increase a contact area between the electron injection layer 206 and the second electrode, increase the quantity of electrons, and increase the concentration of the excitons obtained through the combination of the carriers in the light-emitting layer, thereby to further improve the luminescence performance of the display substrate.

Figure 11:
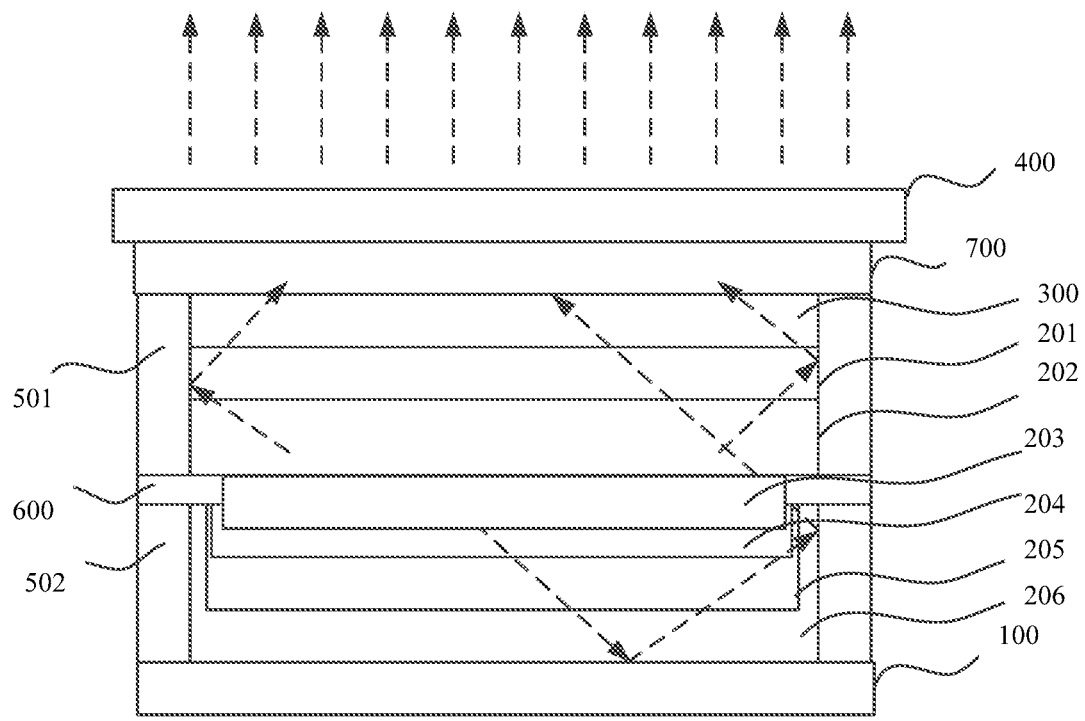

In some embodiments of the present disclosure, as shown in FIG. 11, the organic functional layer 200 includes a hole injection layer 201, a hole transport layer 202, a light-emitting layer 203, a hole blocking layer 204, an electron transport layer 205 and an electron injection layer 206 laminated one on another in a direction away from the base substrate 400. An orthogonal projection of the light-emitting layer 203 onto the base substrate 400 is located within an orthogonal projection of the hole blocking layer 204 onto the base substrate 400, and the hole blocking layer 204 covers a side surface of the light-emitting layer 203. The orthogonal projection of the hole blocking layer 204 onto the base substrate 400 is located within an orthogonal projection of the electron transport layer 205 onto the base substrate 400, and the electron transport layer 205 covers a side surface of the hole blocking layer 204. The orthogonal projection of the electron transport layer 205 onto the base substrate 400 is located within an orthogonal projection of the electron injection layer 206 onto the base substrate 400, the electron insulation layer 206 covers a side surface of the electron transport layer 205, and the side surface of the electron transport layer 205 is not in contact with the second reflection pattern 502. In an organic functional material, generally the hole is transmitted at a speed larger than the electron, and the light-emitting region of the light-emitting layer 203 is arranged proximate to the second electrode 100. Through the structure in FIG. 11, it is able to reinforce the injection of the electrons, and enable the light-emitting region to move from a side proximate to the second electrode 100 to a center of the light-emitting layer 203, thereby to prevent the overall performance of the device from being adversely affected when the excitons are accumulated at a certain interface.

Figure 12:
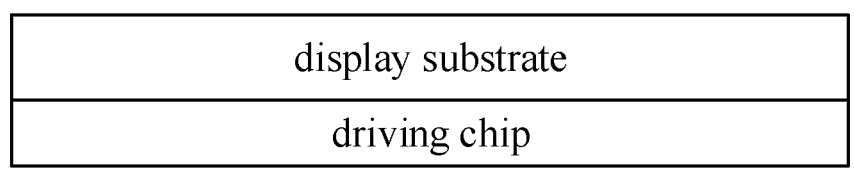
FIG. 12 is a schematic view showing a display device according to an embodiment of the present disclosure.

As shown in FIG. 12, the present disclosure further provides in some embodiments a display device, which includes the above-mentioned display substrate and a driving chip. The display device has a same structure and a same beneficial effect as the above-mentioned display substrate, which will thus not be particularly defined herein.

Based on the above, in a possible embodiment of the present disclosure, the first electrode of the display substrate is located at a side of the second electrode distal to the base substrate, i.e., the display substrate is of a top-emission type. The light exits from the display substrate at the top, so as to prevent the light from being adversely affected by Thin Film Transistors (TFTs) on the substrate, thereby to provide the device with a high aperture ratio. In addition, in the case of a given material, it is able to reduce an operating voltage of the top-emission device, thereby to prolong a service life of the device.

The display device includes, but not limited to, a radio frequency unit, a network module, an audio output unit, an input unit, a sensor, a display unit, a user input unit, an interface unit, a memory, a processor, and a power source. It should be appreciated that, the display device is limited thereto, i.e., it may include more or fewer members, or some members may be combined, or the members may be arranged in different modes. In the embodiments of the present disclosure, the display device includes, but not limited to, display, mobile phone, flat-panel computer, television, wearable electronic device or navigator.

The display device may be any product or member having a display function, e.g., television, display, digital photo frame, mobile phone or tablet computer. The display device may further includes a flexible circuit board, a printed circuit board and a back plate.

It should be further appreciated that, the above embodiments have been described in a progressive manner, and the same or similar contents in the embodiments have not been repeated, i.e., each embodiment has merely focused on the difference from the others. Especially, the method embodiments are substantially similar to the product embodiments, and thus have been described in a simple manner.

Unless otherwise defined, any technical or scientific term used herein shall have the common meaning understood by a person of ordinary skills. Such words as "first" and "second" used in the specification and claims are merely used to differentiate different components rather than to represent any order, number or importance. Similarly, such words as "one" or "one of" are merely used to represent the existence of at least one member, rather than to limit the number thereof. Such words as "include" or "including" intends to indicate that an element or object before the word contains an element or object or equivalents thereof listed after the word, without excluding any other element or object. Such words as "connect/connected to" or "couple/coupled to" may include electrical connection, direct or indirect, rather than to be limited to physical or mechanical connection. Such words as "on", "under", "left" and "right" are merely used to represent relative position relationship, and when an absolute position of the object is changed, the relative position relationship will be changed too.

It should be appreciated that, in the case that such an element as layer, film, region or substrate is arranged "on" or "under" another element, it may be directly arranged "on" or "under" the other element, or an intermediate element may be arranged therebetween.

In the above description, the features, structures, materials or characteristics may be combined in any embodiment or embodiments in an appropriate manner.

The above embodiments are for illustrative purposes only, but the present disclosure is not limited thereto. Obviously, a person skilled in the art may make further modifications and improvements without departing from the spirit of the present disclosure, and these modifications and improvements shall also fall within the scope of the present disclosure. A protection scope of the present disclosure is defined by the attached claims.

What is claimed is:

1. A display substrate, comprising:
   a base substrate; and
   a light-emitting element arranged on the base substrate, and comprising a first electrode, an organic functional layer and a second electrode arranged sequentially in that order in a direction away from the base substrate,
   wherein the light-emitting element comprises a first surface proximate to the base substrate, a second surface distal to the base substrate, and a side surface arranged between the first surface and the second surface,
   wherein the display substrate further comprises a reflection layer covering only a part of the side surface and configured to reflect light from the organic functional layer;
   wherein the reflection layer is made of a conductive material;
   wherein the reflection layer comprises a first reflection pattern in contact with the first electrode and a second reflection pattern in contact with the second electrode, and an insulation pattern is arranged between the first reflection pattern and the second reflection pattern;
   wherein the organic functional layer comprises a hole injection layer, a hole transport layer, a light-emitting layer, a hole blocking layer, an electron transport layer and an electron injection layer laminated one on another in that order in the direction away from the base substrate, the first reflection pattern is insulated from the hole blocking layer, and the second reflection pattern is insulated from the hole transport layer.

2. The display substrate according to claim 1, wherein a thickness of the reflection layer in a direction parallel to the base substrate is greater than or equal to 50 nm and smaller than or equal to 100 nm.

3. The display substrate according to claim 1, wherein
   an orthogonal projection of the hole transport layer onto the base substrate is located within an orthogonal projection of the hole injection layer onto the base substrate, the hole injection layer covers a side surface of the hole transport layer, and the hole transport layer is not in contact with the first reflection pattern; and
   an orthogonal projection of the light-emitting layer onto the base substrate is located within the orthogonal projection of the hole transport layer onto the base substrate, the hole transport layer covers a part of a side surface of the light-emitting layer, and the light-emitting layer is not in contact with the first reflection pattern.

4. The display substrate according to claim 3, wherein the orthogonal projection of the hole injection layer onto the base substrate is located within an orthogonal projection of the first electrode onto the base substrate, the first electrode covers a side surface of the hole injection layer, and the hole injection layer is not in contact with the first reflection pattern.

5. The display substrate according to claim 1, wherein
   the orthogonal projection of the light-emitting layer onto the base substrate is located within the orthogonal projection of the hole blocking layer onto the base substrate;
   the orthogonal projection of the hole blocking layer onto the base substrate is located within the orthogonal projection of the electron transport layer onto the base substrate, the electron transport layer covers a side surface of the hole blocking layer, and the hole blocking layer is not in contact with the second reflection pattern.

6. The display substrate according to claim 5, wherein
   the orthogonal projection of the electron transport layer onto the base substrate is located within the orthogonal projection of the electron injection layer onto the base substrate, the electron injection layer covers a side surface of the electron transport layer, and the side surface of the electron transport layer is not in contact with the second reflection pattern.

7. The display substrate according to claim 6, wherein
   the orthogonal projection of the electron injection layer onto the base substrate is located within an orthogonal projection of the second electrode onto the base substrate, the second electrode covers a side surface of the electron injection layer, and the side surface of the electron injection layer is not in contact with the second reflection pattern.

8. The display substrate according to claim 1, further comprising:
   a light extraction layer arranged at a light-exiting side of the light-emitting element, and a refractive index of the light extraction layer is smaller than a refractive index of the base substrate.

9. The display substrate according to claim 8, wherein
   the light extraction layer is of a single-layered structure having a refractive index gradually decreasing in a light emergent direction, and the light emergent direction is a direction in which the light extraction layer faces away from the organic functional layer; or
   the light extraction layer is made of a spherical molecular material; or the light extraction layer is provided with a plurality of hemispherical micro-structures arranged in an array form at a side surface of the light extraction layer proximate to the light-emitting element.

10. The display substrate according to claim 8, wherein the light extraction layer is made of a first refractive material having a first refractive index and a second refractive material having a second refractive index, and the first refractive index of the first refractive material is greater than the second refractive index of the second refractive material, wherein in the light extraction layer, in a direction away from the light-emitting element, a content of the first refractive material gradually decreases and a content of the second refractive material gradually increases, so that a refractive index of the light extraction layer gradually decreases in a light emergent direction.

11. A display device, comprising the display substrate according to claim 1 and a driving chip.

12. The display device according to claim 11, wherein a thickness of the reflection layer in a direction parallel to the base substrate is greater than or equal to 50 nm and smaller than or equal to 100 nm.

* * * * *